(12) United States Patent
Salter et al.

(10) Patent No.: US 12,184,275 B2
(45) Date of Patent: Dec. 31, 2024

(54) VEHICLE DOOR POSITIONING SYSTEM

(71) Applicant: Ford Global Technologies, LLC, Dearborn, MI (US)

(72) Inventors: Stuart C. Salter, White Lake, MI (US); Paul Kenneth Dellock, Northville, MI (US); Kristopher Karl Brown, Dearborn, MI (US); Fedor Balayev, Ypsilanti, MI (US); Cornel Lewis Gardner, Romulus, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 165 days.

(21) Appl. No.: 17/980,668

(22) Filed: Nov. 4, 2022

(65) Prior Publication Data
US 2023/0057056 A1 Feb. 23, 2023

Related U.S. Application Data

(63) Continuation of application No. 16/382,706, filed on Apr. 12, 2019, now Pat. No. 11,522,543.

(51) Int. Cl.
*G01V 3/08* (2006.01)
*E05F 15/46* (2015.01)
*H03K 17/955* (2006.01)

(52) U.S. Cl.
CPC ........... *H03K 17/955* (2013.01); *E05F 15/46* (2015.01); *G01V 3/088* (2013.01); *E05Y 2900/546* (2013.01); *H03K 2217/96078* (2013.01)

(58) Field of Classification Search
None
See application file for complete search history.

(56) References Cited

U.S. PATENT DOCUMENTS

| | | | |
|---|---|---|---|
| 6,051,945 A | 4/2000 | Furukawa | |
| 6,848,727 B1 | 2/2005 | Cetnar et al. | |
| 2011/0166694 A1 | 7/2011 | Griffits | |
| 2012/0192489 A1 | 8/2012 | Pribisic | |
| 2017/0152698 A1* | 6/2017 | Bae | E05F 15/73 |
| 2017/0247933 A1* | 8/2017 | Elie | E05F 15/73 |
| 2020/0240114 A1* | 7/2020 | Yamamoto | E02F 9/2285 |

FOREIGN PATENT DOCUMENTS

| | | |
|---|---|---|
| GB | 2435516 A | 2/2006 |
| WO | 02068782 A1 | 9/2002 |

* cited by examiner

*Primary Examiner* — Vincent Q Nguyen
(74) *Attorney, Agent, or Firm* — Vichit Chea; Price Heneveld LLP

(57) ABSTRACT

A vehicle includes a body and a door coupled to the body. The door is operable between opened and closed positions. A cinch assembly is operably coupled to the door. A door seal is positioned along at least a portion of a door opening, wherein the door seal includes a first conductor and a second conductor positioned therein. The first and second conductors are dielectrically isolated and cooperate to generate a capacitive signal. A controller is configured to monitor the capacitive signal and control the cinch assembly in response to the capacitive signal.

19 Claims, 9 Drawing Sheets

VEHICLE DOOR POSITIONING SYSTEM

CROSS-REFERENCE TO RELATED APPLICATION

This application is a continuation of—U.S. application Ser. No. 16/382,706, filed on Apr. 12, 2019, now U.S. Pat. No. 11,522,543 entitled "VEHICLE DOOR POSITIONING SYSTEM," the disclosure of which is hereby incorporated herein by reference in its entirety.

FIELD OF THE DISCLOSURE

The present disclosure generally relates to a door positioning system, and more specifically a vehicle door positioning system including a cinch assembly.

BACKGROUND OF THE DISCLOSURE

Vehicles may include a mechanism for moving a door to a position flush with a body of the vehicle. Further, a vehicle may have a liftgate rear door with obstacle detection in the form of a pinch strip. The pinch strip may include wires for proximity sensing.

SUMMARY OF THE DISCLOSURE

According to at least one aspect of the present disclosure, a vehicle includes a body and a door coupled to the body. The door is operable between opened and closed positions. A cinch assembly is operably coupled to the door. A door seal is positioned along at least a portion of a door opening, wherein the door seal includes a first conductor and a second conductor positioned therein. The first and second conductors are dielectrically isolated and cooperate to generate a capacitive signal. A controller is configured to monitor the capacitive signal and control the cinch assembly in response to the capacitive signal.

According to another aspect of the present disclosure, a vehicle includes a body and a door coupled to the body. The door is operable between cinched positions. The cinched positions include a flush position and a subflush position relative to the body, respectively. An image sensor is coupled to the body and has an imaging field of view. A controller is configured to control the cinch assembly in response to a sensed image from the image sensor.

According to another aspect of the present disclosure, a vehicle door positioning system includes a vehicle door operable between opened and closed positions. The vehicle door is further operable between more than one cinched position relative to a vehicle body when in the closed position. A cinch assembly is operably coupled to a vehicle door. A door seal is positioned along a portion of a door opening, and the door seal includes first and second conductors that are dielectrically isolated and cooperate to generate a capacitive signal. A controller configured to control the cinch assembly to move the vehicle door to a selected cinched position of the multiple cinched positions in response to the capacitive signal.

These and other aspects, objects, and features of the present disclosure will be understood and appreciated by those skilled in the art upon studying the following specification, claims, and appended drawings.

BRIEF DESCRIPTION OF THE DRAWINGS

The following is a description of the figures in the accompanying drawings. The figures are not necessarily to scale, and certain features and certain views of the figures may be shown exaggerated in scale or in schematic in the interest of clarity and conciseness.

In the drawings.

DETAILED DESCRIPTION OF THE PREFERRED EMBODIMENTS

Additional features and advantages of the disclosure will be set forth in the detailed description which follows and will be apparent to those skilled in the art from the description, or recognized by practicing the disclosure as described in the following description, together with the claims and appended drawings.

Figure 1:
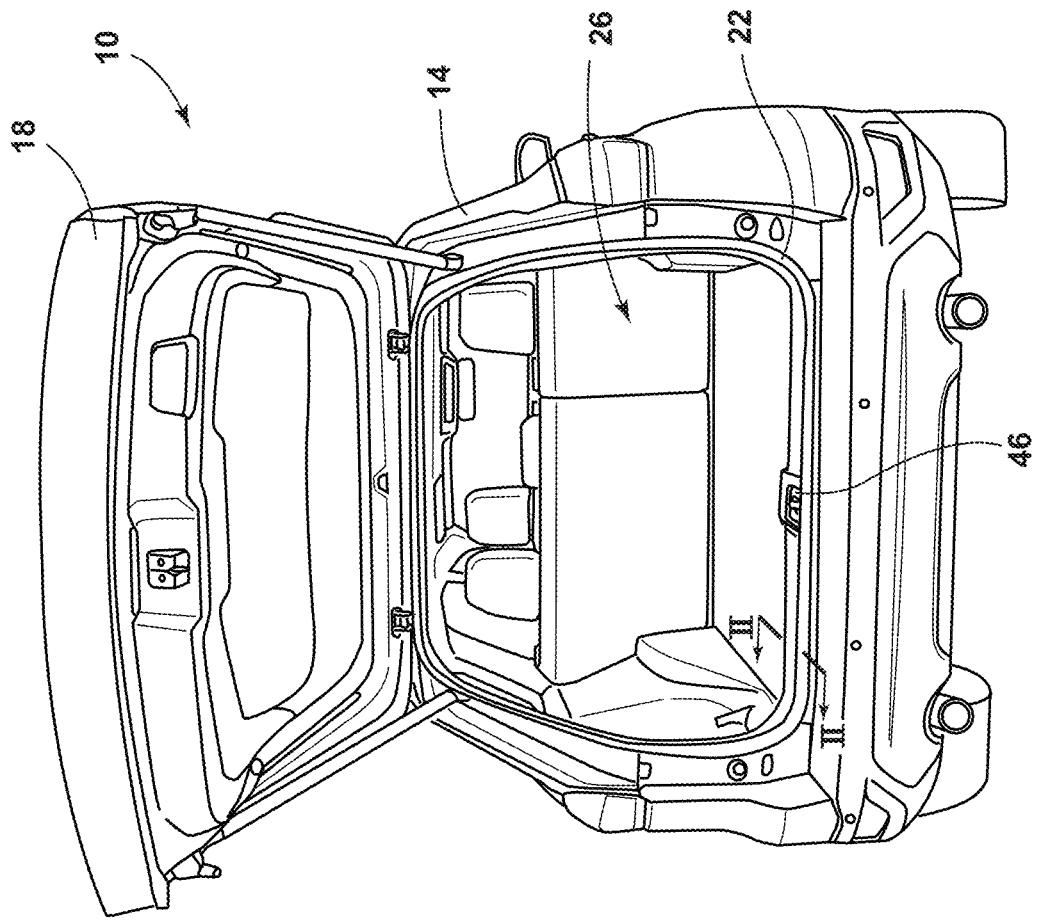
FIG. 1 is a rear perspective view of a vehicle having a liftgate in an opened position, according to one example.

For purposes of description herein, the terms "upper," "lower," "right," "left," "rear," "front," "vertical," "horizontal," and derivatives thereof shall relate to the concepts as oriented in FIG. 1. In this document, relational terms, such as first and second, top and bottom, and the like, are used solely to distinguish one entity or action from another entity or action, without necessarily requiring or implying any actual such relationship or order between such entities or actions. However, it is to be understood that the concepts may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

As used herein, the term "and/or," when used in a list of two or more items, means that any one of the listed items can be employed by itself, or any combination of two or more of the listed items, can be employed. For example, if a composition is described as containing components A, B, and/or C, the composition can contain A alone; B alone; C alone; A and B in combination; A and C in combination; B and C in combination; or A, B, and C in combination.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the end-points of each of the ranges are significant both in relation to the other end-point, and independently of the other end-point.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other, such as within about 5% of each other, or within about 2% of each other.

As used herein the terms "the," "a," or "an," mean "at least one," and should not be limited to "only one" unless explicitly indicated to the contrary. Thus, for example, reference to "a component" includes embodiments having two or more such components unless the context clearly indicates otherwise.

The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

It is also important to note that the construction and arrangement of the elements of the disclosure, as shown in the exemplary embodiments, is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts, or elements shown as multiple parts may be integrally formed, the operation of the interfaces may be reversed or otherwise varied, the length or width of the structures, and/or members, or connectors, or other elements of the system, may be varied, and the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

Referring to FIGS. 1-8, reference numeral 10 generally refers to a vehicle having a body 14 and a door 18 operably coupled to the body 14, where the door 18 is operable between opened and closed positions. A door seal 22 is positioned along at least a portion of a door opening 26. The door seal 22 may include a first conductor 30 and a second conductor 34 positioned therein, where the first and second conductors 30, 34 cooperate to generate a capacitive signal. A controller 38 may be configured to monitor the capacitive signal and control the cinch assembly 42 in response to the capacitive signal.

Referring to FIG. 1, the vehicle 10 includes the door 18 illustrated as a liftgate in an opened position. The liftgate may be one style of door 18 coupled to the body 14 of the vehicle 10. Other styles of doors 18 may include, for example, a trunk lid, a rear door, and side doors. The door seal 22 is positioned along a portion of the door opening 26. The door seal 22 may be used with any style of door 18 on the vehicle 10. The vehicle 10 may be any style of vehicle 10 including, but not limited to, sedans, cross-overs, trucks, vans, and sport utility vehicles. As illustrated in FIG. 1, the door seal 22 extends around the entire perimeter of the door opening 26, however, it is contemplated that the door seal 22 may not extend around the entire perimeter. The door seal 22 may include, for example, rubber materials and/or plastic materials. The door 18 is operable between the opened position and the closed position, and the vehicle 10 may include a latch 46 for retaining the door 18 in the closed position.

Figure 2:
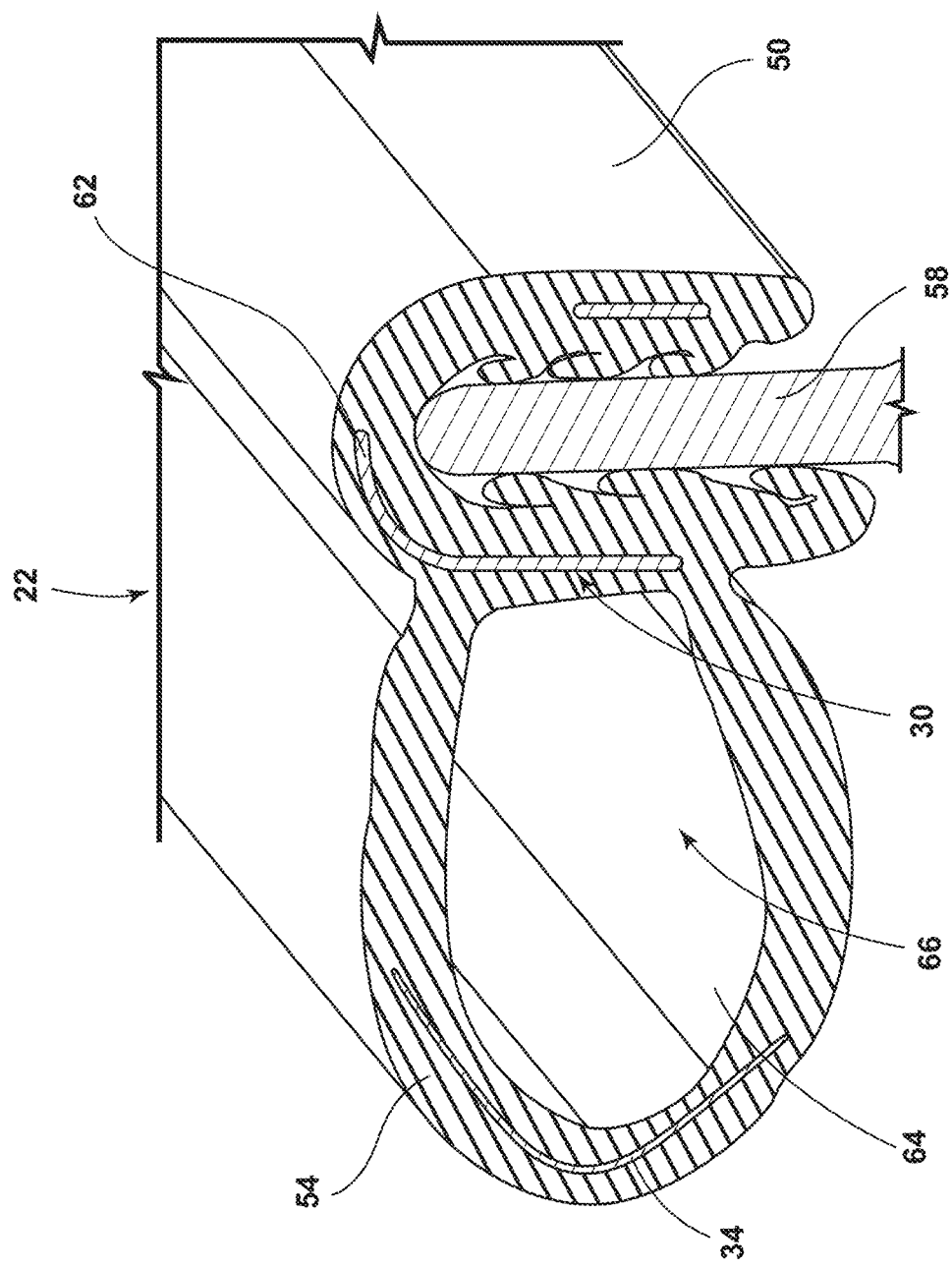
FIG. 2 is a cross-sectional view of the vehicle taken along lines II-II of FIG. 1 of a portion of a door seal, according to one example.

Referring to FIGS. 1 and 2, the door seal 22 includes a flange mount portion 50 and a compressible portion 54. The flange mount portion 50 is generally U-shaped for coupling to the body 14 of the vehicle 10. The compressible portion 54 extends in a vehicle-rearward direction from the flange mount portion 50, and therefore may be disposed between the flange mount portion 50 and the door 18 when the door 18 is in the closed position. In various examples, the body 14 defines a flange 58 which, when assembled, is positioned within the flange mount portion 50 of the door seal 22. As illustrated in FIG. 2, the flange extends generally parallel to the door 18 when the door 18 is in a closed position. In various examples, the flange mount portion 50 may include a reinforcement member 62. The reinforcement member 62 may be disposed within the flange mount portion 50 of the door seal 22 proximate to the compressible portion 54 (e.g., in a vehicle-rearward portion of the flange mount portion 50). The reinforcement member 62 may increase the strength of the door seal 22. The reinforcement member 62 may include, for example, metal materials or metal alloy materials. In various examples, the reinforcement member 62 includes, for example, steel or aluminum.

The first and second conductors 30, 34 are disposed within the door seal 22. The compressible portion 54 defines an interior channel 66. In various examples, the first and second conductors 30, 34 are spaced apart by the interior channel 66 of the compressible portion 54 of the door seal 22. In the embodiment of FIG. 2, the first conductor 30 is the reinforcement member 62. It may be advantageous to utilize the reinforcement member 62 as the first conductor 30 to decrease manufacturing and production costs. However, as discussed in relation to FIG. 3, the first conductor 30 may not be the reinforcement member 62. The second conductor 34 may be positioned within the compressible portion 54. The second conductor 34 may be, for example, a metal foil, sheet, or strip. A metal foil, sheet, or strip may be advantageous for increasing width and thereby increasing the area of the second conductor 34.

Figure 3:
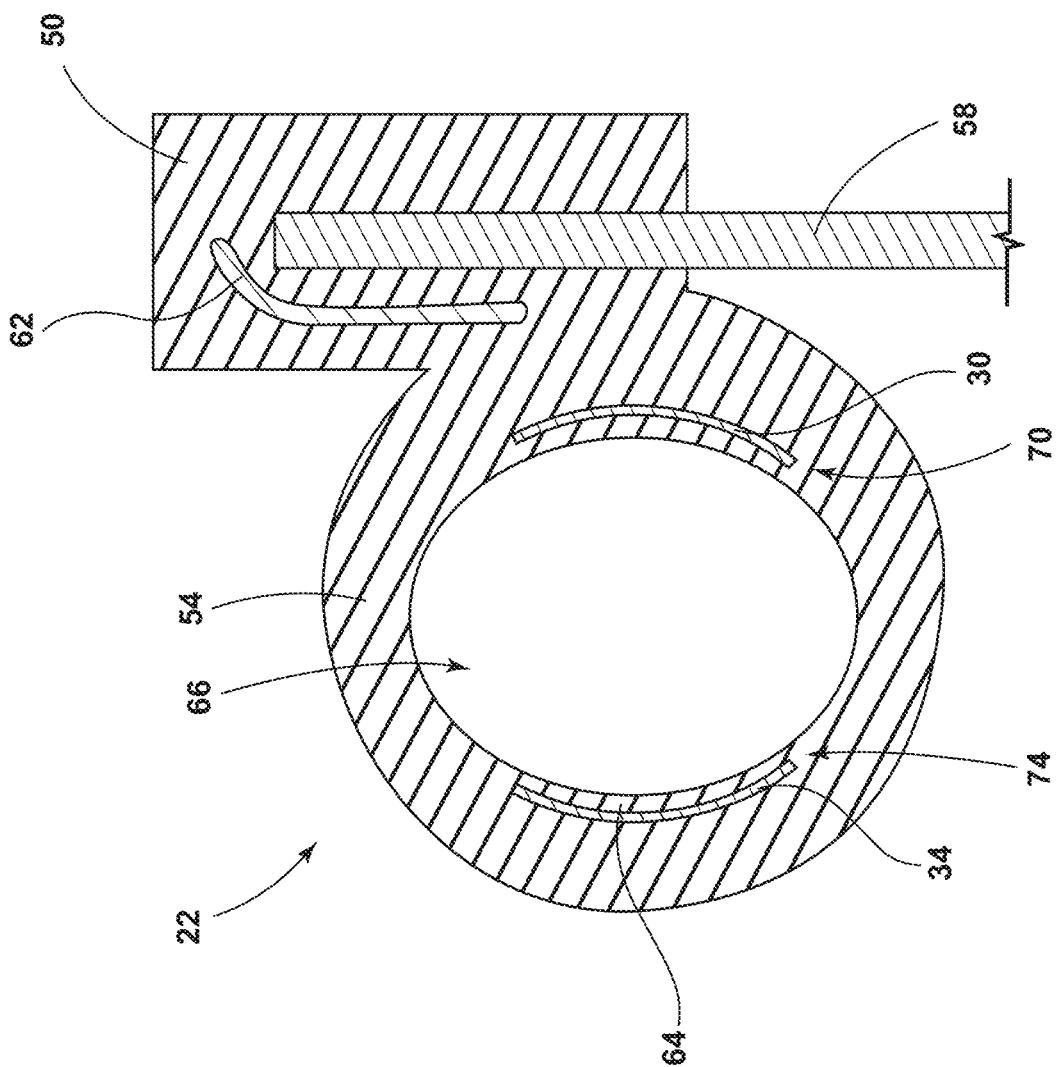
FIG. 3 is a cross-sectional view of the vehicle taken along lines II-II of FIG. 1 of a portion of a door seal, according to one example.

Referring to FIG. 3, in various examples, the first and second conductors 30, 34 may both be metal foils, sheets, or strips disposed in the compressible portion 54 of the door seal 22. Additionally or alternatively, the first and second conductors 30, 34 may define various patterns, such as, for example, interdigitated fingers. Similar to the exemplary embodiment of FIG. 2, the exemplary embodiment shown in FIG. 3 includes the first and second conductors 30, 34 spaced apart by the interior channel 66. In such examples, the first conductor 30 may be disposed in a vehicle-forward portion 70 of the compressible portion 54 and the second conductor 34 may be disposed in a vehicle-rearward portion 74 of the compressible portion 54. In other words, the second conductor 34 may be positioned in a more vehicle-rearward direction than the first conductor 30. Additionally or alternatively, the first and second conductors 30, 34 may be positioned in opposing side portions of the compressible portion 54 of the door seal 22. The second conductor 34 may be positioned proximate to the door 18 when the door 18 is in the closed position. It is also contemplated the first conductor 30 may be positioned within the flange mount portion 50. Additionally or alternatively, the door seal 22 may also include the reinforcement member 62 in addition to the first and second conductors 30, 34.

Refereeing to FIGS. 1-3, the first and second conductors 30, 34 may be embedded within the door seal 22. Accordingly, the first and second conductors 30, 34 may not come into direct contact with one another, which may prevent the first and second conductors 30, 34 from shorting together. Each of the first and second conductors 30, 34 may have a width in a range of from about 0.25 cm to about 5 cm. The first and second conductors 30, 34 may have a thickness in a range of from 0.001 mm to 0.01 mm. In a specific examples, the first and second conductors 30, 34 may have a thickness of about 0.005 mm. The first and second conductors 30, 34 having a thickness in a range of from about 0.001 mm to about 0.01 mm may be advantageous to prevent the first and second conductors 30, 34 from affecting the stiffness of the door seal 22. As illustrated in FIGS. 2 and 3, the first and second conductors 30, 34 are configured as strips. The greater width of the strip configuration may then provide a greater area of the first and second conductors 30, 34, respectively.

In various examples, the first and second conductors 30, 34 have a dielectric layer 64 of rubber and air between the first and second conductors 30, 34 and cooperate via an electric field to generate a capacitive signal when one of a first and second conductor is applied with a signal. In other words, the first and second conductors 30, 34 are dielectrically isolated. In various examples, a voltage is applied to at least one of the first and second conductors 30, 34. The other of the first and second conductors 30, 34 may be configured to ground the circuit. A processor may charge the first or second conductor 30, 34 to a predefined voltage. The processor may be configured to time the amount of time for the voltage to drain down to a fixed resistor to about 0 volts. The length of time to drain, capacitance, and charge to one of the first and second conductors 30, 34 may be proportional. An increased area of the first and second conductors 30, 34 may result in a greater capacitance, as capacitance and area are directly proportional. A greater area may also be advantageous for proper alignment of the first and second conductors 30, 34. The chance of misalignment of the first and second conductors 30, 34 may decrease with the increased area. The larger area of the first and second conductors 30, 34 may also assist in distinguishing smaller capacitance changes from noise created by typical vehicle motion. Additionally or alternatively, the strip configuration may create a greater capacitive signal, which increases a signal to noise ratio enabling increased accuracy in measurements. The strip configuration of the first and second conductors 30, 34 may be further advantageous for increasing accuracy for measuring the generated capacitive signal. It is also contemplated that different sizes and/or arrangements of the first and second conductors 30, 34 may be utilized depending on the stiffness and/or configuration of the door seal 22.

In operation, when the door 18 is moving into the closed position, the door 18 may first come into contact with the compressible portion 54. The door 18 may then compress the compressible portion 54 toward the flange mount portion 50. The compressible portion 54 and the interior channel 66 may deform, thereby decreasing the distance between the vehicle-rearward portion 74 of the compressible portion 54 and the flange mount portion 50. Accordingly, the second conductor 34 is moved into closer proximity of the first conductor 30. The change in distance between the first and second conductors 30, 34 is inversely proportional to the capacitance. Accordingly, the decreased distance between the first and second conductors 30, 34 corresponds with a higher capacitance, and an increased distance corresponds with a lower capacitance.

Figure 4B:
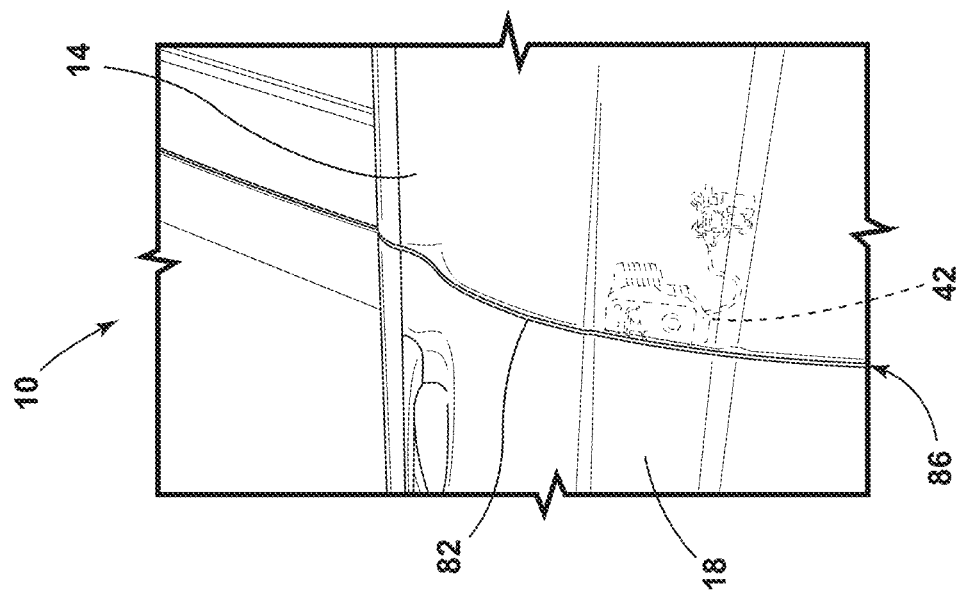
FIG. 4B is a partial view of the door of the vehicle in a cinched position, according to one example.
Figure 4A:
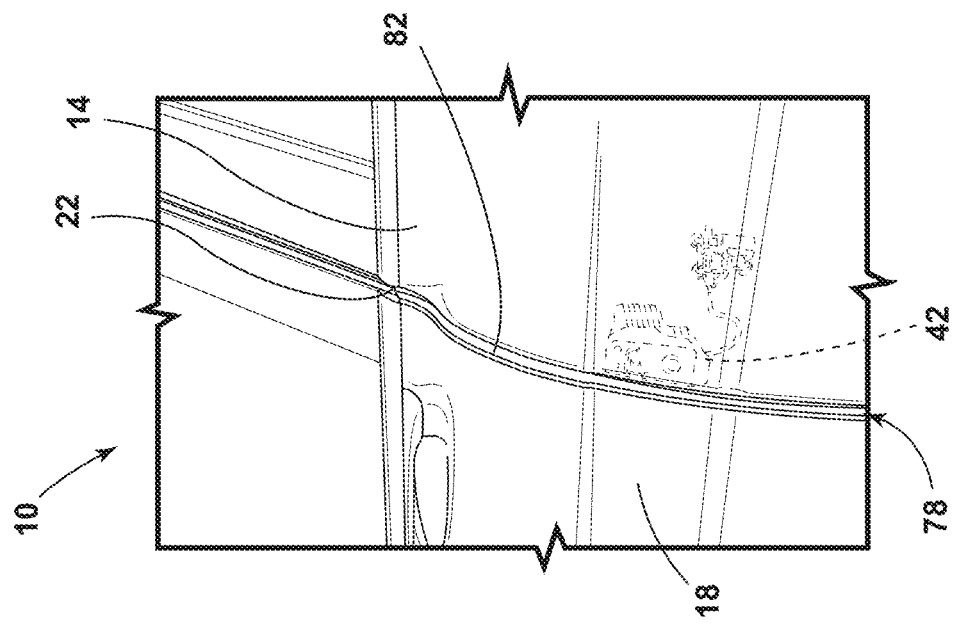
FIG. 4A is a partial view of a door of the vehicle in a non-cinched position, according to one example.

Referring now to FIGS. 4A and 4B, the cinch assembly 42 may be operably coupled to the door 18. In various examples, the cinch assembly 42 may be operably coupled to more than one door 18. In further examples, there may be a cinch assembly 42 that corresponds to each door 18. The cinch assembly 42 may be disposed on the body 14 of the vehicle 10 and/or an adjacent door 18 and may be substantially hidden from view. In various examples, the cinch assembly 42 may be a power cinch assembly including a motor. As illustrated in FIG. 4A, the door 18 is illustrated in a non-cinched position 78. When in a non-cinched position 78, an edge 82 of the door 18 may be spaced apart from the body 14. The cinch assembly 42 is configured to move the door 18 to more than one cinched position 86, which may include a flush position relative to the body 14 when the door 18 is in the closed position. As illustrated in FIG. 4B, when the door 18 is in the flush position, the edge 82 of the door 18 may be substantially aligned (i.e., flush) with the body 14. Additionally or alternatively, the cinched position 86 may include a subflush position. Accordingly, the cinch assembly 42 may also be configured to move the door 18 to the subflush position relative to the body 14. In various examples, there may be more than one subflush position. In such examples, the cinch assembly 42 may operate to move the door 18 to at least one of a maximum subflush position and at least one intermediate subflush position, where the intermediate subflush positions are between the flush position and the maximum subflush position. In other words, the door 18 may be operable between more than one cinched position 86 when in the closed position. The subflush positions may result in the door 18 being moved an additional distance in a range of from about 1 mm to about 10 mm relative to the flush position. The additional distance for the subflush position may not result in a noticeable movement of the door 18 to an occupant within the vehicle 10. In various examples, the maximum subflush position may result in the door 18 moving an additional distance in a range of from about 1 mm to about 3 mm, about 3 mm to about 5 mm, about 5 mm to about 7 mm, about 7 mm to about 10 mm, or a combination thereof. The maximum subflush position may depend on the door seal 22, the door 18, and/or the vehicle 10. The maximum subflush position may also be determined by a user and/or may be adjustable. In various examples, the subflush positions may be a fixed distance relative to the flush position. Additionally or alternatively, the subflush position may be variable distances relative to the flush position. The subflush positions may be advantageous for improving sealing under certain conditions (e.g., temperature, wind, road conditions, etc.). Additionally or alternatively still, the cinch assembly 42 may move the door 18 to the flush position and/or the subflush position while the vehicle 10 is in motion.

Figure 5:
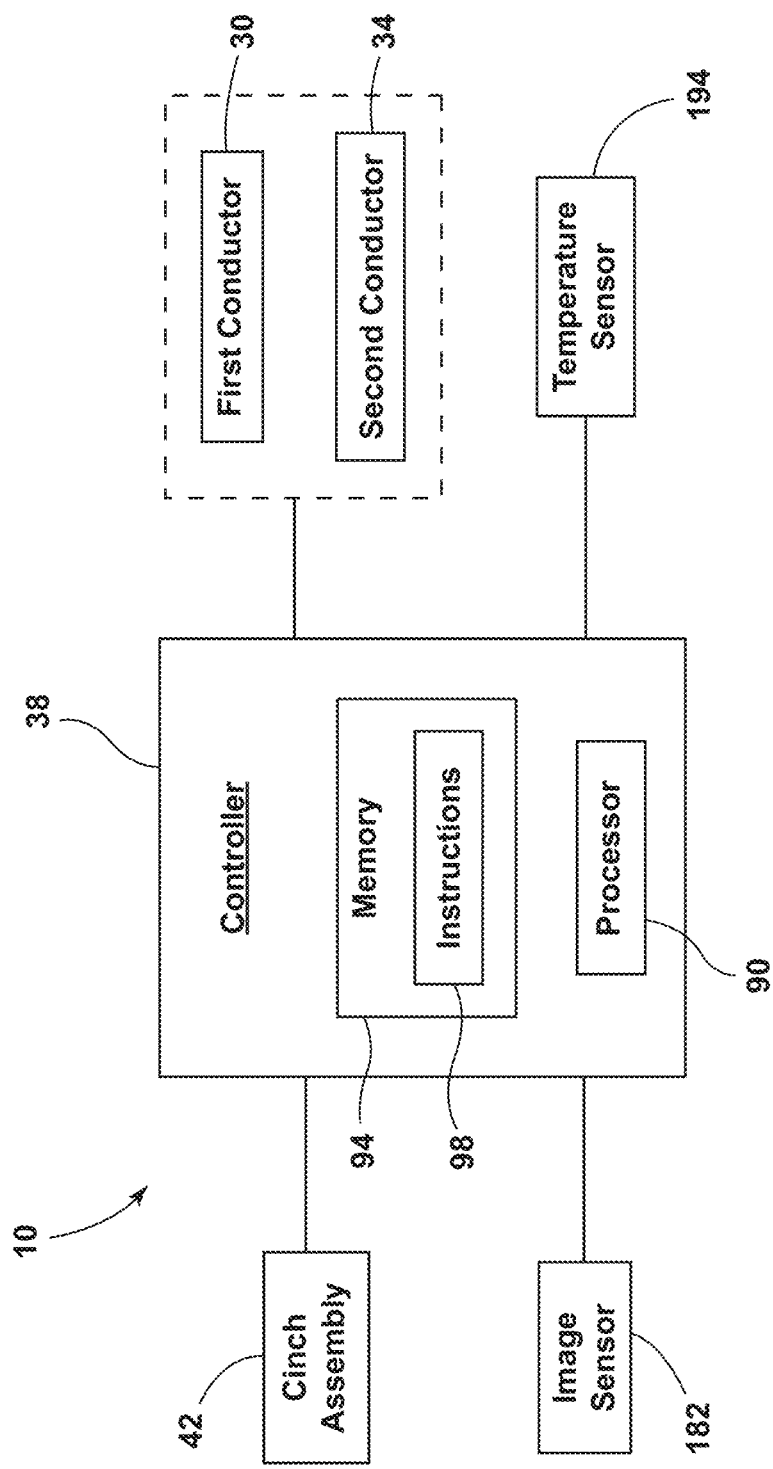
FIG. 5 is a block diagram of the vehicle, according to one example.

Referring to FIG. 5, the controller 38 may include a processor 90, other control circuitry, and a memory 94. Stored in the memory 94 and executable by the processor 90 are various instructions 98. At least one instruction 98 may relate to the control of the cinch assembly 42. The controller 38 may also include instructions 98 relating to positioning the door 18 (FIG. 1) via the cinch assembly 42 in response to a capacitive signal, a sensed image, and/or a sensed temperature. Accordingly, the controller 38 may be operably coupled to the cinch assembly 42. The controller 38 may be the controller 38 for the vehicle 10, or may be a separate controller 38. Additionally or alternatively, the controller 38 may be a vehicle control module and/or a body control module. The controller 38 may also be disposed in various locations on the vehicle 10. The controller 38 may also be operably coupled to the first and second conductors 30, 34 of the door seal 22.

Figure 6:
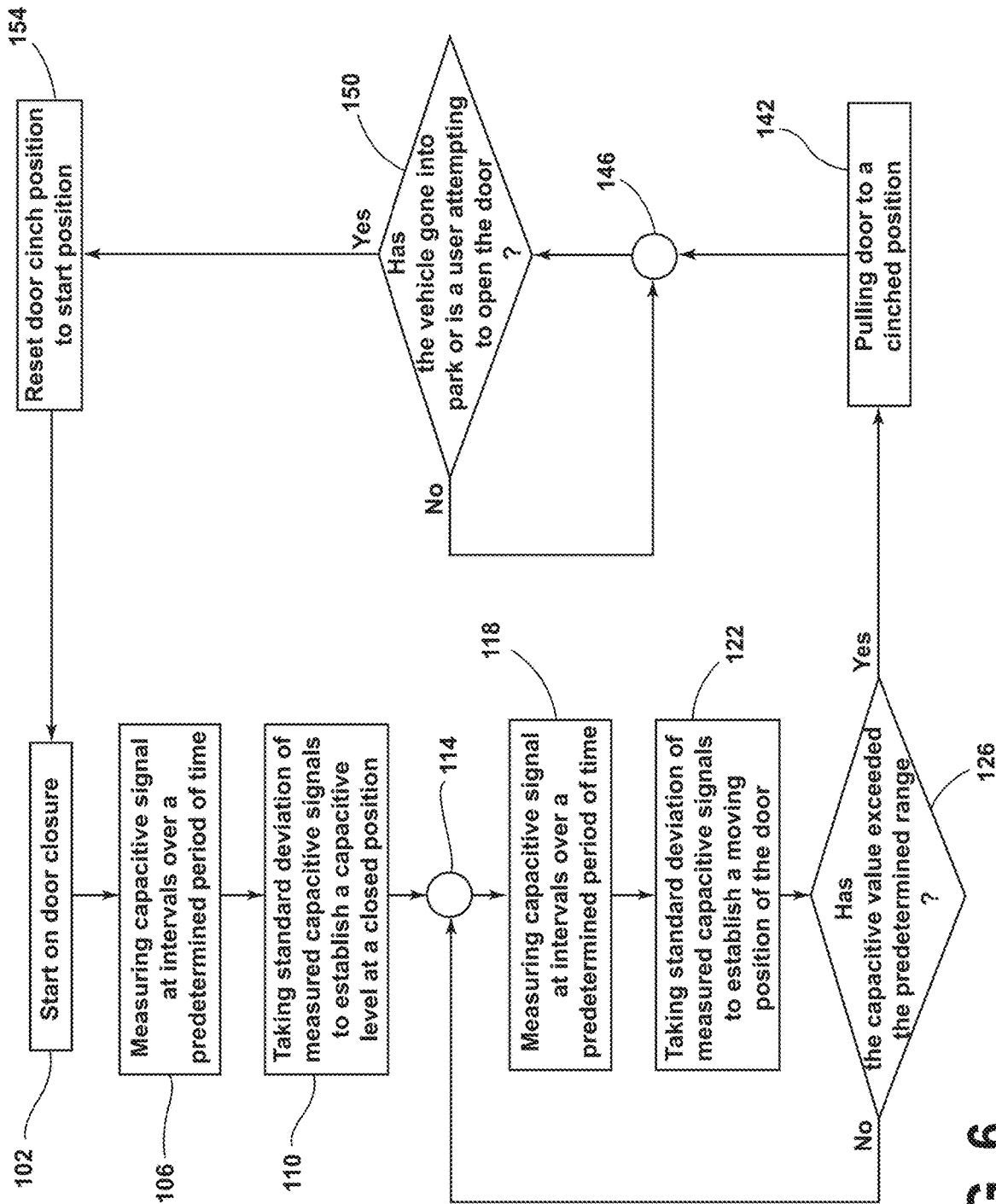
FIG. 6 is a flow diagram of a method for positioning the door of the vehicle, according to one example.
Figure 7:
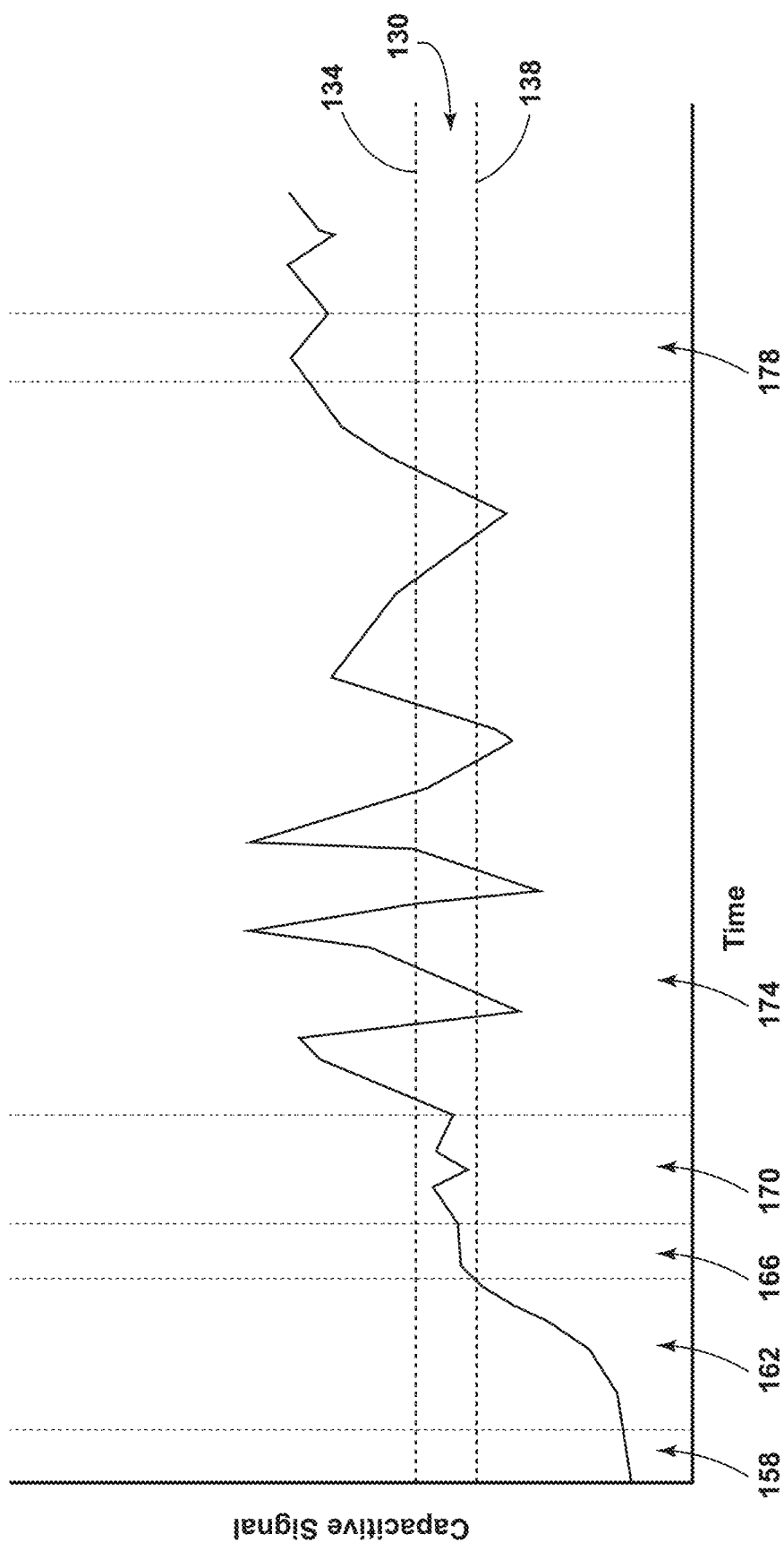
FIG. 7 is a graphical representation of a capacitive signal with respect to time, according to one example.

Referring to FIGS. 1, 5, and 6, at least one instruction 98 of the controller 38 begins at step 102 when the door 18 is moved to the closed position. The closed position may be the non-cinched position 78 or the cinched position 86. Next, in step 106, the controller 38 may measure the capacitive signal at predetermined intervals for a predetermined amount of time. In various examples, the controller 38 may take measurements in a range of from about 50 measurements to about 100 measurements per 5 mS. In a specific example, the controller 38 may take about 64 measurements per every 5 mS. However, it is contemplated that any variation of measurements per time intervals may be used without departing from the teachings herein. The measurements over predetermined intervals for a predetermined amount of time may be advantageous to track forward and backward movement of the door 18 when in the closed position through the change in capacitance between the first and second conductors 30, 34. Next, at step 110, the controller 38 may take the standard deviation of the measured capacitive signals to establish a capacitive signal level at a closed position of the door 18. The standard deviation may be advantageous to account for both the forward and backward movement of the door 18. The capacitive signal measured in the closed position of the door 18 may define a predetermined capacitance range.

At step 114, the controller 38 may stop taking measurements for a predetermined amount of time. The predetermined amount of time may be substantially the same or different then step 106. It is also contemplated that the controller 38 may not stop taking measurements (e.g., skip step 114) without departing from the teachings herein. Next, at step 118, the controller 38 may again take measurements of the capacitive signal at predetermined intervals for a predetermined amount of time. The predetermined intervals and/or the predetermined amount of time may be substantially the same or different than those in step 106. Similar to step 106, in step 114, the controller 38 may take measurements in a range of from about 50 measurements to about 100 measurements per 5 mS. At a next step 122, the controller 38 may take the standard deviation of the measured capacitive signals to establish a capacitive signal level of a moving position of the door 18. The moving position includes the forward and backward movements of the door 18 when in the closed position.

Referring to FIGS. 1 and 5-8, next, the instructions 98 proceed to a decision step 126, where the controller 38 determines whether the measured capacitive signal (e.g., the standard deviation) exceeds outer boundaries of a predetermined capacitive range 130. The controller 38 may include instructions 98 defining the predetermined capacitive range 130. The predetermined capacitive range 130 may vary based on the make and/or model of the vehicle 10 and/or the user and may also be adjustable. The predetermined capacitive range 130 includes an upper boundary 134 and a lower boundary 138. In step 126, the controller 38 may compare the measured capacitive signal to at least one of the upper boundary 134 and the lower boundary 138. If the measured capacitive signals do not exceed the upper and/or lower boundaries 134, 138, the instruction 98 returns to step 114, before proceeding again to step 118 of measuring capacitive signals. If the measured capacitive signals do exceed at least one of the upper and lower boundaries 134, 138, the instruction 98 proceeds to step 142. The instruction 98 may immediately proceed to step 142 if the measured capacitive signals exceed at least one of the upper and lower boundaries 134, 138 of a predetermined capacitive range 130, or may proceed to step 142 after the measured capacitive signals exceed at least one of the upper and lower boundaries 134, 138 for a predetermined amount of time.

In step 142, the controller 38 may control the cinch assembly 42 to move the door 18 to one of the cinched positions 86, including the flush position, the intermediate subflush positions, and the maximum subflush position. The step 142 may occur while the vehicle 10 is in motion. The cinched position 86 may depend on the measured capacitive signals. In other words, the controller 38 may be configured to monitor the capacitive signal and control the cinch assembly 42 in response to the capacitive signal. In various examples, the subflush positions may be a fixed distance relative to the flush position. Additionally or alternatively, the subflush positions may be variable distances relative to the flush position in response to the capacitive signals. The cinched position 86 selected by the controller 38 may depend on the sensed capacitive signal, a sensed temperature, and/or a sensed image. The controller 38 may be configured to control the cinch assembly 42 when the capacitive signal exceeds at least one of the upper and lower boundaries 134, 138 of the predetermined capacitive range 130. Once the door 18 is moved to the cinched position 86, the instruction 98 proceeds to step 146, where the cinch assembly 42 maintains the door 18 in the cinched position 86 of step 142. Maintaining the door 18 in a same cinched position 86 may be advantageous for preventing and/or delaying premature wear to the cinch assembly 42. The instruction 98 then proceeds to decision step 150, where the controller 38 may determine whether the vehicle 10 has been shifted to a park vehicle 10 gear position (e.g., the vehicle 10 is parked). At step 150, the controller 38 may also determine whether an interior handle of the door 18 has moved such that an occupant may be attempting to open the door 18. If the controller 38 determines that the vehicle 10 is not in a park gear position and the interior handle has not moved, then the instruction 98 returns to step 146 of maintaining the door 18 in the cinched position 86. If the controller 38 determines at least one of the vehicle 10 is in the park gear position or the interior handle has moved, the instruction 98 proceeds to step 154.

Still referring to FIGS. 1, 5, and 6, in a next step 154, the controller 38 may control the cinch assembly 42 to return the door 18 to the closed position. The closed position may be the non-cinched position 78 or the flush position. In other words, the controller 38 may control the cinch assembly 42 to move the door 18 to the flush position relative to the body 14 in response to at least one of the park vehicle gear position and movement of a door handle. The instruction 98 then returns to step 102. The instruction 98 may be applied to each door 18 and cinch assembly 42 combination.

Referring now to FIGS. 1 and 5-7, an exemplary measured capacitive signal is illustrated. In a first length of time 158, the door 18 is in the opened position, which may result in a lower capacitive signal due to the greater distance between the first and second conductors 30, 34. In a second length of time 162, the door 18 is moved to the closed position, compressing the door seal 22 and thereby decreasing the distance between the first and second conductors 30, 34. Accordingly, the capacitive signal may increase. In a third length of time 166, the door 18 is in the closed position. The capacitive signal may substantially constant and within the predetermined capacitive range 130 defined by the controller 38. In a fourth length of time 170, the vehicle 10 is in motion, which may cause movement of the door 18 when in the closed position. This movement may be forward and backward movement of the door 18 which may result in a change of capacitance between the first and second conductors 30, 34. In various examples, the small movements of the door 18 produce changes in capacitance within the predetermined capacitive range 130. In a fifth length of time 174, the movement of the door 18 increases which may result in the capacitive signal exceeding at least one of the upper and lower boundaries 134, 138 of the predetermined capacitive range 130. Various conditions may cause the increased door movement, such as, for example, road conditions, high winds, and increased temperatures. In a sixth length of time 178 of the exemplary measured capacitive signal, the controller 38 may control the cinch assembly 42 to move the door 18 to a cinched position 86. In various examples, the cinched position 86 is one of the subflush positions. The capacitive signal may increase as a result of the decreasing distance between the first and second conductors 30, 34 as capacitance and distance are inversely proportional. However, moving the door 18 to the cinched position 86 may limit and/or prevent the movement of the door 18 and may improve sealing of the door 18 by generating more force on the door 18 from the door seal 22. It may be further advantageous to include the first and second conductors 30, 34 for generating a capacitive signal to improve noise, vibration, and harshness (NVH) under certain conditions. It will be contemplated that the capacitive signal measured by the controller 38 may vary based on the vehicle 10 and/or the operation of the vehicle 10.

Figure 8:
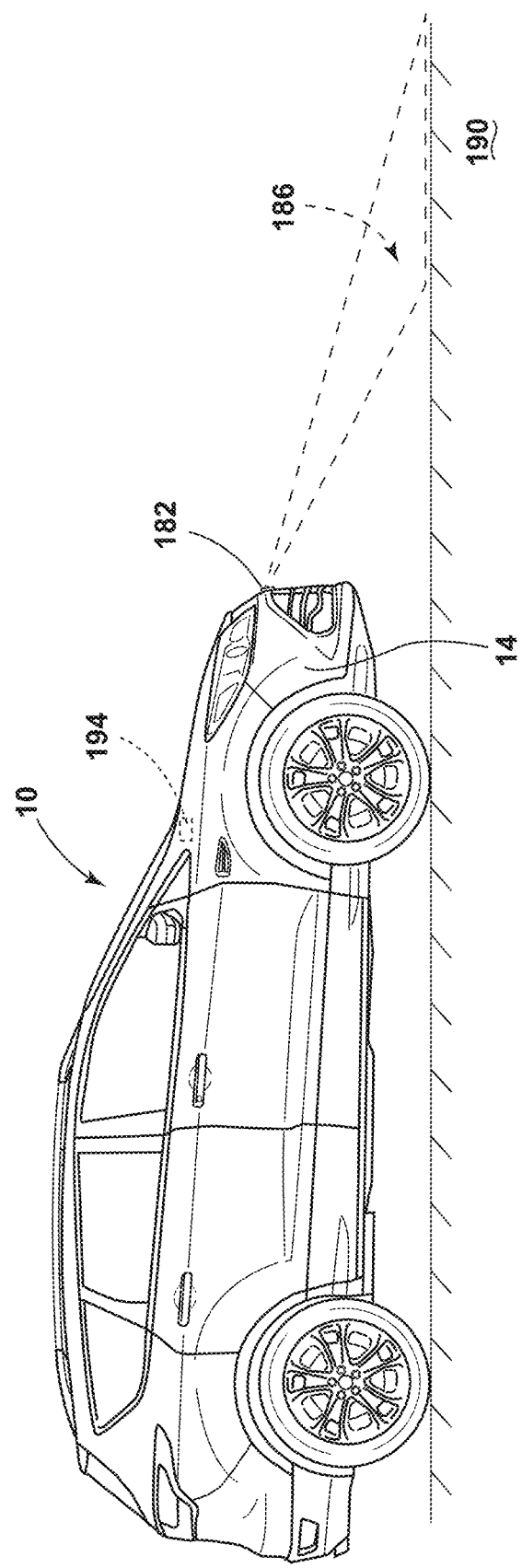
FIG. 8 is a side perspective view of the vehicle including an image sensor having an imaging field of view, according to one example.

Referring now to FIGS. 5 and 8, in various examples, the vehicle 10 may include an image sensor 182 coupled to the body 14. The image sensor 182 may be, for example, a camera. The image sensor 182 may be an area-type image sensor, such as a CCD or a CMOS image sensor and image-capturing optics, which captures an image of an imaging field of view 186 defined by the image-capturing optics. In specific examples, the image sensor 182 may be coupled to a front portion of the body 14 and the imaging field of view 186 extends forwardly therefrom. The imaging field of view 186 may include a ground area 190 proximate to the vehicle 10. In various examples, the controller 38 may include a Computerized Computational Damping feature (CCD) stored within the memory 94 and/or instructions 98. The CCD may cooperate with the image sensor 182 to scan the ground area 190 proximate to the vehicle 10 and predict the roughness of the ground area 190 (e.g., bumpiness). The controller 38 may then control the cinch assembly 42 based on the anticipated ground conditions of the ground area 190. In other words, the controller 38 may control the cinch assembly 42 in response to a sensed image from the image sensor 182. For example, if the sensed image is determined by the controller 38 to include rough and/or bumpy conditions, the controller 38 may control the cinch assembly 42 to move the door 18 to the subflush position. If the sensed image is determined by the controller 38 to include smooth conditions and/or substantially similar conditions to the current conditions, the door 18 may be maintained in the same closed position. Additionally or alternatively, the controller 38 may be configured to precalibrate the subflush position proportional to the expected ground condition within the imaging field of view 186. In other words, the controller 38 may determine the expected roughness of the ground conditions and control the cinch assembly 42 to move the door 18 to a certain subflush position in anticipation of the rough ground conditions. In various examples, the subflush positions may be a fixed distance relative to the flush position. Additionally or alternatively, the subflush positions may be variable distances relative to the flush position in response to the sensed image. The image sensor 182 may work in combination with the first and second conductors 30, 34. Additionally or alternatively, the image sensor 182 may work if the first and second conductors 30, 34 are disabled (e.g., not generating a capacitive signal). It may be advantageous to include the image sensor 182 to improve NVH under certain conditions.

Referring still to FIGS. 5 and 8, the controller 38 may be operably coupled to a temperature sensor 194. The temperature sensor 194 may be configured to sense ambient temperature. In other words, the temperature sensor 194 may be an ambient temperature sensor. The controller 38 may control the cinch assembly 42 in response to a sensed temperature and/or a sensed ambient temperature of the temperature sensor 194. In various examples, the controller 38 may be configured to control the cinch assembly 42 to move the door 18 to at least one of the flush position and the subflush position (e.g., a cinched position) when the sensed temperature exceeds a predetermined temperature. The predetermined temperature may be, for example, about 70° F., about 80° F., about 90° F., about 100° F., or a temperature therebetween. The predetermined temperature may be adjustable. In various examples, the controller 38 may preemptively control the cinch assembly 42 to move to the door 18 to the flush position and/or the subflush position in response to the sensed temperature. In other words, the door 18 may move to the flush and/or subflush positions prior to significant movement of the door 18 in the closed position. In various examples, the subflush positions may be a fixed distance relative to the flush position. Additionally or alternatively, the subflush positions may be variable distances relative to the flush position in response to the sensed temperature. It may be advantageous to include a temperature sensor 194 to improve NVH under hot conditions. Further, hot conditions may decrease the stiffness of the door seal 22 allowing increased movement of the door 18 in the closed position. Accordingly, the temperature sensor 194 may allow for anticipation of the increased movement. The temperature sensor 194 may work in combination with the first and second conductors 30, 34, the image sensor 182 and/or a combination thereof. Additionally or alternatively, the temperature sensor may work if one or both of the image sensor 182 and the first and second conductors 30, 34 are disabled.

Figure 9:
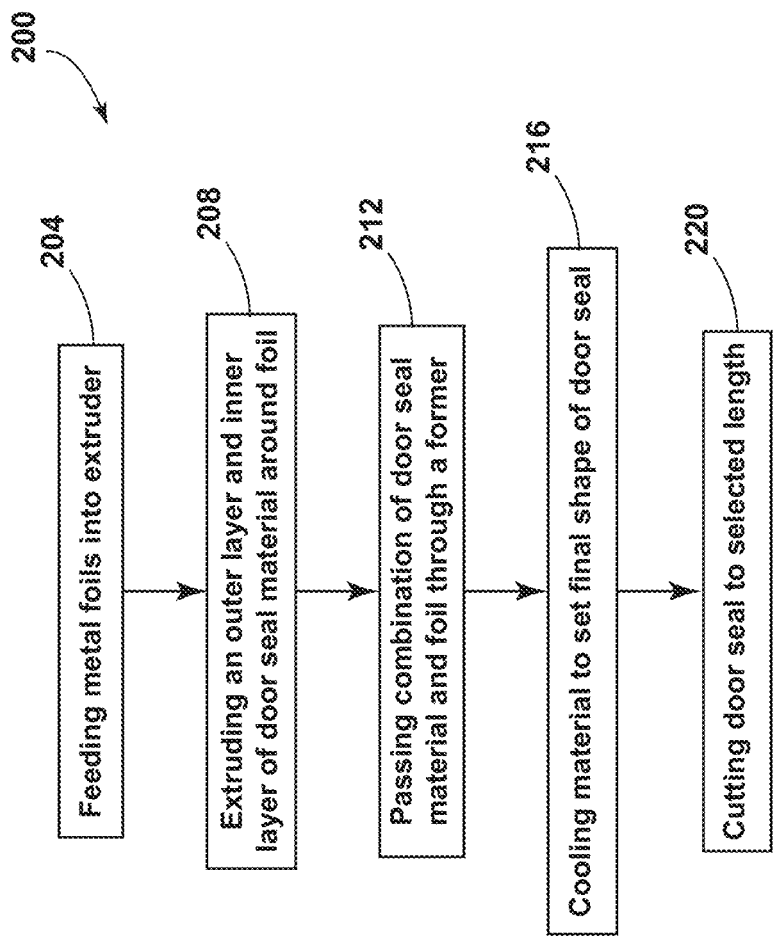
FIG. 9 is a flow diagram of a method of manufacturing the door seal with first and second conductors, according to one example.

Referring now to FIG. 9, and with further reference to FIGS. 1-8, a method 200 of manufacturing the door seal 22 having the first and second capacitors includes a step 204 of feeding metal foil sheets into an extruder. In various examples, the metal foil sheets include aluminum or other metal or metal alloy materials. The metal foil sheets may be the first and second conductors 30, 34. A next step 208 includes extruding an outer layer and an inner layer of door seal 22 material around the metal foil sheets (e.g., the first and second conductors 30, 34). The extruded material of step 208 may be plastic materials, rubber materials, or a combination thereof. The extrusion of step 208 may be performed in a hollow crosshead die. Next, a step 212 includes passing the material embedded the first and second conductors 30, 34 through a former. In this step 212, the material is formed into the selected shape for the door seal 22. In step 216, the door seal 22 is cooled to set the final shape of the door seal 22. Next, in a step 220, the door seal 22 (e.g., the extrusion) is cut to the selected length for the door seal 22.

Use of the present disclosure may provide a variety of advantages. First, including the first and second conductors 30, 34 as metal sheets, foils, or strips may increase accuracy of the capacitive signal and may prevent misalignment. Second, embedding the first and second conductors 30, 34 within the door seal 22 may prevent the first and second conductors 30, 34 from shorting together. Third, moving the door 18 to one of the subflush positions may improve NVH under various conditions, such as, for example, high winds, rough ground area 190 conditions (e.g., bumpy roads), and/or higher temperatures. Fourth, the first and second conductors 30, 34 may measure the door 18 position, which can replace a conventional door ajar switch and accompanying wiring. Fifth, the image senor and/or the temperature sensor 194 may improve NVH under various conditions when the first and second conductors 30, 34 are disabled (e.g., not generating a capacitive signal).

According to various examples, the vehicle includes a body and a door coupled to the body. The door is operable between opened and closed positions. A cinch assembly is operably coupled to the door. A door seal is positioned along at least a portion of a door opening, wherein the door seal includes a first conductor and a second conductor positioned therein. The first and second conductors are dielectrically isolated and cooperate to generate a capacitive signal. A controller is configured to monitor the capacitive signal and control the cinch assembly in response to the capacitive signal. Embodiments of the present disclosure may include one or a combination of the following features:

the door seal includes a flange mount portion and a compressible portion;

the first conductor is a metal foil and the second conductor is a reinforcement member;

the first and second conductors are positioned on opposing side portions of the compressible portion;

the controller includes instructions relating to a predetermined capacitive range;

the controller is configured to control the cinch assembly when the capacitive signal exceeds at least one of the upper and lower boundaries of the predetermined capacitive range for a predetermined amount of time;

the cinch assembly is configured to move the door to a flush position and a subflush position relative to the body, respectively;

the controller controls the cinch assembly to move the door to a subflush position relative to the body in response to the capacitive signal;

the controller controls the cinch assembly to move the door to a flush position relative to the body in response to at least one of a park vehicle gear position and movement of a door handle;

an image sensor, wherein the controller controls the cinch assembly in response to a sensed image a temperature sensor, wherein the controller controls the cinch assembly in response to a sensed temperature;

a door seal positioned along at least a portion of a door opening;

the seal includes a first conductor and a second conductor positioned therein, and the first and second conductors are dielectrically isolated and cooperate to generate a capacitive signal;

the image sensor is coupled to a front portion of the body, and the imaging field of view extends forwardly therefrom;

the subflush positions include a maximum subflush position and at least one intermediate subflush position, and at least one intermediate subflush position is between the flush position and the maximum subflush position;

the more than one cinched position includes a flush position, a maximum subflush position, and at least one intermediate subflush position therebetween;

an ambient temperature sensor, the controller controls the cinch assembly in response to a sensed ambient temperature; and an image sensor having an imaging field of view, the controller controls the cinch assembly in response to a sensed image.

Modifications of the disclosure will occur to those skilled in the art and to those who make or use the disclosure. Therefore, it is understood that the embodiments shown in the drawings and described above are merely for illustrative purposes and not intended to limit the scope of the disclosure, which is defined by the following claims, as interpreted according to the principles of patent law, including the doctrine of equivalents.

It is to be understood that variations and modifications can be made on the aforementioned structure without departing from the concepts of the present disclosure, and further it is to be understood that such concepts are intended to be covered by the following claims unless these claims by their language expressly state otherwise.

What is claimed is:

1. A vehicle, comprising:

a body;

a side door coupled to the body and operable between cinched positions, wherein the cinched positions include a flush position and subflush positions relative to the body, respectively;

a cinch assembly operably coupled to the side door and configured to move the door between the flush position and the subflush positions;

an image sensor coupled to the body, the image sensor having an imaging field of view including a ground area proximate to the body; and a controller configured to:

control the cinch assembly in response to image data from the image sensor;

analyze the image data from the image sensor to predict a roughness of the ground area; and activate the cinch assembly to adjust the side door from the flush position to one of the subflush positions when the controller determines the image data includes a rough condition of the ground area.

2. The vehicle of claim 1, wherein the image sensor is coupled to a front portion of the body, and further wherein the imaging field of view extends forwardly therefrom.

3. The vehicle of claim 1, wherein the subflush positions include a maximum subflush position and at least one intermediate subflush position, and further wherein the at least one intermediate subflush position is between the flush position and the maximum subflush position.

4. The vehicle of claim 1, wherein the controller is configured to analyze the image data from the image sensor to determine a level of roughness of the ground area, and wherein the controller is configured to select which of the subflush positions to adjust the side door in response to the level of roughness.

5. The vehicle of claim 1, further comprising:
a temperature sensor configured to sense ambient temperature, and wherein the controller is configured to activate the cinch assembly to adjust the side door in response to sensed ambient temperature.

6. A vehicle side door positioning system, comprising:
a body;
a side door coupled to the body, wherein the side door is operable between an opened position and a closed position, and wherein the side door is further operable between a flush position and subflush positions relative to the body when the side door is in the closed position;
an image sensor coupled to the body, wherein the image sensor defines a field of view extending forward from the body to capture image data of a ground area proximate the body;
a cinch assembly configured to adjust the side door between the flush position and the subflush positions; and
a controller operably coupled to the image sensor and the cinch assembly, wherein the controller is configured to:
analyze the image data to determine a condition of the ground area;
activate the cinch assembly based on the condition of the ground area; and
determine which of the subflush positions to adjust the side door based on a level of roughness of the ground area.

7. The vehicle side door positioning system of claim 6, wherein the controller is configured to determine the condition of the ground area is rough and, in response, adjust the side door to one of the subflush positions.

8. The vehicle side door positioning system of claim 6, wherein each subflush position is a predefined distance from the flush position.

9. The vehicle side door positioning system of claim 6, wherein each subflush position is a variable distance from the flush position based on the image data.

10. The vehicle side door positioning system of claim 6, wherein the controller is configured to determine the condition of the ground area is smooth and, in response, maintains the side door in a current position.

11. The vehicle side door positioning system of claim 6, wherein the side door is aligned with the body when in the flush position and recessed relative to the body when in the subflush positions.

12. The vehicle side door positioning system of claim 6, wherein the subflush positions include multiple intermediate subflush positions and a maximum subflush position, the multiple intermediate subflush positions between the flush position and the maximum subflush position.

13. The vehicle side door positioning system of claim 6, wherein the controller is configured to activate the cinch assembly to adjust the side door to the flush position in response to movement of a handle on the side door.

14. A vehicle door positioning system, comprising:
a body;
a side door coupled to the body, wherein when the side door is in a closed position the side door is operable between a flush position with the side door aligned with the body and a subflush position with the side door recessed relative to the body;
an image sensor coupled to the body, wherein the image sensor defines a field of view to capture image data of a ground area proximate the body;
a cinch assembly operably coupled to the side door, wherein the cinch assembly is configured to adjust the side door between the flush position and the subflush position; and
a controller configured to analyze the image data to determine a condition of the ground area proximate the body, and wherein the controller is configured to control the cinch assembly to move the door between the flush position and the subflush position based on the condition of the ground area.

15. The vehicle door positioning system of claim 14, wherein the side door is configured to move between one millimeter and ten millimeters from the flush position to the subflush position.

16. The vehicle door positioning system of claim 14, wherein the controller is configured to determine the condition of the ground area is rough and, in response, activate the cinch assembly to adjust the side door to the subflush position.

17. The vehicle door positioning system of claim 14, wherein the field of view of the image sensor extends forward from a front of the body.

18. The vehicle door positioning system of claim 14, wherein the controller is configured to analyze the image data from the image sensor to predict a roughness of the ground area.

19. The vehicle door positioning system of claim 18, wherein the controller is configured to activate the cinch assembly to adjust the side door from the flush position to the subflush position when the controller determines the image data includes a rough condition of the ground area.

* * * * *